(12) United States Patent
Miao

(10) Patent No.: US 11,563,193 B2
(45) Date of Patent: Jan. 24, 2023

(54) DISPLAY DEVICE AND PACKAGE METHOD THEREOF

(71) Applicant: Shenzhen China Star Optoelectronics Semiconductor Display Technology Co., LTD., Guangdong (CN)

(72) Inventor: Yang Miao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 505 days.

(21) Appl. No.: 16/613,199

(22) PCT Filed: Sep. 23, 2019

(86) PCT No.: PCT/CN2019/107304
§ 371 (c)(1),
(2) Date: Nov. 13, 2019

(87) PCT Pub. No.: WO2020/244101
PCT Pub. Date: Dec. 10, 2020

(65) Prior Publication Data
US 2021/0343976 A1    Nov. 4, 2021

(30) Foreign Application Priority Data
Jun. 3, 2019 (CN) .......................... 201910476378.1

(51) Int. Cl.
| H01L 51/52 | (2006.01) |
| H01L 51/56 | (2006.01) |
| H01L 27/32 | (2006.01) |

(52) U.S. Cl.
CPC ...... *H01L 51/5246* (2013.01); *H01L 51/5259* (2013.01); *H01L 51/56* (2013.01); *H01L 27/3248* (2013.01)

(58) Field of Classification Search
CPC . H01L 51/5246; H01L 51/5259; H01L 51/56; H01L 51/0024; H01L 27/3251; H01L 51/5068; H01L 27/322
USPC ........................................ 257/40; 438/82, 99
See application file for complete search history.

(56) References Cited

U.S. PATENT DOCUMENTS

| 2008/0239637 A1 | 10/2008 | Sung et al. |
| 2013/0048967 A1 | 2/2013 | Nishido et al. |
| 2015/0179721 A1* | 6/2015 | Lee ..................... H01L 27/3258 257/40 |

(Continued)

FOREIGN PATENT DOCUMENTS

| CN | 103594488 A | 2/2014 |
| CN | 105549272 A | 5/2016 |

(Continued)

*Primary Examiner* — Thinh T Nguyen

(57) ABSTRACT

The present invention provides a display device, including a display panel and an encapsulation cover disposed on the display panel. Two circles of border sealant are sequentially disposed at intervals between the bonding area of the encapsulation cover and the display panel from periphery to the inside. The invention provides a display device, which adopts a novel encapsulation structure so that it can effectively prevent external water and oxygen from invading into the internal display panel, and therefore improve its own stability.

7 Claims, 2 Drawing Sheets

(56) References Cited

U.S. PATENT DOCUMENTS

2016/0155993 A1    6/2016   Nishido et al.

FOREIGN PATENT DOCUMENTS

| | | |
|---|---|---|
| CN | 110265565 A | 9/2019 |
| JP | 2012048841 A | 3/2012 |
| TW | 201310740 A | 3/2013 |

\* cited by examiner

DISPLAY DEVICE AND PACKAGE METHOD THEREOF

FIELD OF INVENTION

The present invention relates to the field of flat display technology, and in particular, to a display device and a package method thereof, for example, an organic light emitting diode (OLED) display device, but is not limited thereto.

BACKGROUND OF INVENTION

It is known that a packaging process is an indispensable process in the structure of a display panel with a chip, which is used to protect the chip and the display panel to realize their normal use.

Taking large-size OLED television as an example, the package methods that are usually used mainly include two types. One is a face seal package, and the other is a dam (border sealant)/getter (moisture absorbent)/filler package.

Further, in a case of the dam sealant/getter/filler package method, one common structure is generally that an outer periphery is a dam sealant, and a getter is arranged on an inner side of the dam sealant. Thereafter, a filler is filled on an inside of the getter. And finally, a package is completed by a bonding process.

In the dam sealant/getter/filler package structure, because the filler has strong fluidity, the filler often comes in contact with the getter on the outside after bonding. And because the getter used therein usually contains alkaline metal oxide, when they are in contact, a chemical reaction occurs and an alcohol product is produced.

Thus, after a long period of use, with the chemical reaction progresses, the alcohol products produced by the reaction are correspondingly increased. The accumulated alcohol products will inevitably affect the organic light emitting diode (OLED) panel inside, and cause it to deteriorate.

Therefore, when water and oxygen permeate into a dam sealer, and in a case that the getter cannot quickly and completely absorb the intrusive water vapor, the dam sealer not only cannot prevent the water and oxygen from damaging the panel but also cannot prevent the water and oxygen from invading the filler through the getter. It will greatly affect an internal OLED panel.

Therefore, it is necessary to develop a new type of display device and the package method thereof to overcome the drawbacks of the prior art.

Technical Problem

One aspect of the present invention is to provide a display device that adopts a novel package structure to effectively insulate external water and oxygen from intrusion, and thereby improve its stability.

Technical Solution

The technical solution adopted by the present invention is as follows:

A display device, including a display panel and an encapsulation cover, disposed on the display panel.

Two circles of border sealant are sequentially disposed at intervals between the bonding area of the encapsulation cover and the display panel from periphery to the inside.

That is to say, it includes an outer border sealant and an inner border sealant, and the outer border sealant and the inner border sealant are arranged at intervals.

Compared with the current package method of single border sealant, the invention provides outer border sealant and inner border sealant, such that even water vapor and oxygen invade the outer border sealant, there is still an inner border sealant to block the water vapor and oxygen, thereby display panel inside can work more stable.

Further, in one embodiment, an inner side of the inner border sealant is provided with filler (fill glue).

Further, in one embodiment, the inner border sealant is provided spaced apart from the filler. The specific distance between the two depends on the needs, and there is no limit as long as ensuring that they do not contact each other.

Further, in one embodiment, a desiccant is further disposed between the outer border sealant and the inner border sealant.

The desiccant is used for quickly absorbing water vapor intruding into the outer border sealant, so that the invaded water vapor does not accumulate too much, and thus does not cause too much pressure to the inner border sealant.

Further, in one embodiment, the desiccant includes getter, but is not limited thereto.

Further, in one embodiment, the outer border sealant is provided spaced apart from the desiccant. The specific distance between the two depends on the needs, and there is no limit as long as ensuring that they do not contact each other.

Further, in one embodiment, the desiccant is provided spaced apart from the inner border sealant. The specific distance between the two depends on the needs, and there is no limit as long as ensuring that they do not contact each other.

Further, in one embodiment, the display panel includes an organic light emitting diode (OLED) display panel, the OLED display panel sequentially includes a thin film transistor (TFT) array substrate, an OLED device functional layer and a water blocking layer.

Further, in one embodiment, the water blocking layer encapsulates the OLED device functional layer.

Further, in one embodiment, the filler encapsulates the water blocking layer.

Further, a further aspect of the present invention provides a package method of the display device according to the present invention, which includes the following steps:

Step S1, providing a display panel;

Step S2, providing an encapsulation cover, applying an outer border sealant to an outer periphery of an encapsulation area of the encapsulation cover, and then applying an inner border sealant to an inner side of the outer border sealant spaced from the outer border sealant;

Step S3, applying a getter to an area between the outer border sealant and the inner border sealant;

Step S4, applying a filler to an area of the inner side of the inner border sealant; and Step S5, vacuum bonding the display panel with the encapsulation cover and curing the outer border sealant, the getter, the inner border sealant, and the filler, thereby an encapsulation of the display panel is completed.

Further, in one embodiment, the outer border sealant, the getter, the inner border sealant, and the filler are cured by ultraviolet radiation or heating.

BENEFICIAL EFFECT

The present invention relates to a display device which is provided with double-layered border sealants and in combination with a built-in desiccant. Such that even the water vapor permeates the outer border sealant and into the display device, the water vapor will be absorbed by the desiccant. Even if it is not be completely absorbed, there is an inner border sealant to block the water vapor, thereby the stability of the display device is effectively improved.

Further, due to the presence of the inner border sealant, it can function to limit a flow of the filler disposed on an inner side thereof. Thus, the filler disposed on the inner side thereof cannot directly contact the desiccant. Therefore, they will not cause a chemical reaction, and accordingly, no substance will be generated and accumulated to damage the display panel inside the display device. It avoids potential danger.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

The technical solutions of a display device and a package method thereof according to the present invention will be further described in detail below with reference to the accompanying drawings and embodiments.

One embodiment of the present invention provides a display panel and an encapsulation cover provided thereon. The display panel may be an organic light emitting diode (OLED) display panel or a liquid crystal display panel, preferably an OLED display panel.

Hereinafter, an OLED display panel will be described as an example.

Figure 1:
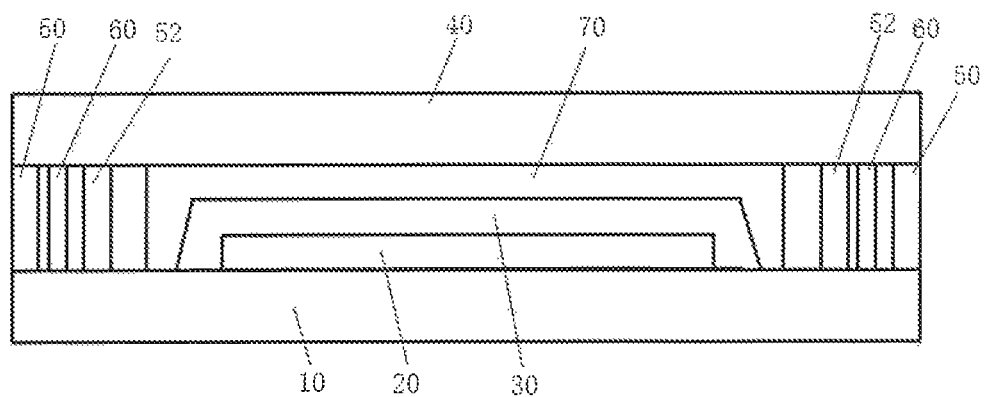
FIG. 1 is a schematic structural diagram showing a display device according to an embodiment of the present invention.

Please refer to FIG. 1, it illustrates a display device according to the present invention, which includes an OLED display panel and an encapsulation cover provided thereon. The OLED display panel includes a thin film transistor (TFT) array substrate 10, on which an OLED device functional layer 20 is disposed. The OLED device functional layer 20 is provided with a water blocking layer 30, wherein the water blocking layer 30 can be prepared by low-temperature PECVD method. The encapsulation cover 40 is disposed on the water blocking layer 30.

Further, an encapsulation area of the encapsulation cover 40 is provided with an outer sealant 50, a desiccant 60, and an inner sealant 52, which are arranged at intervals from the periphery to the inside.

A filler 70 is provided inside the inner sealant 52. The desiccant 60 may be a Getter glue commonly used in the industry but is not limited thereto. The border sealant and the filler may all be Dam glue or Fill glue which is commonly used in the industry but is not limited thereto.

The present invention relates to a display device which is provided with double-layered border sealants and in combination with a built-in desiccant. Therefore, even the water vapor permeates the outer border sealant and into the display device, the water vapor will be absorbed by the desiccant. Even if it is not be completely absorbed, there is an inner sealant to block the water vapor, thereby the stability of the display device is effectively improved.

Further, due to the inner border sealant can function to limit the flow of the filler disposed on the inner side thereof. Thus, the filler disposed on the inner side thereof cannot directly contact the desiccant. Therefore, they will not cause a chemical reaction, and accordingly, no substance will be generated and accumulated to damage the display panel inside the display device. It avoids potential danger.

Further, the display device according to the present invention may be a large-sized television of 50 inches or more, or a large-sized display, depends on the needs, and is not limited.

Figure 2:
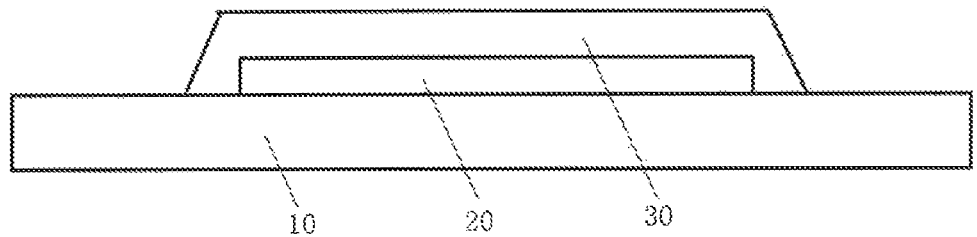
FIG. 2 is a schematic structural diagram, showing a display panel used in step S1 in a method for packaging a display device according to one embodiment of the present invention.
Figure 3:
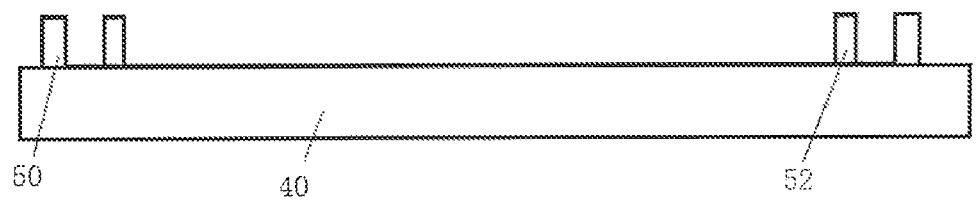
FIG. 3 is a schematic structural view showing an encapsulation cover after step S2 in a package method of the display device illustrated in FIG. 2.
Figure 4:
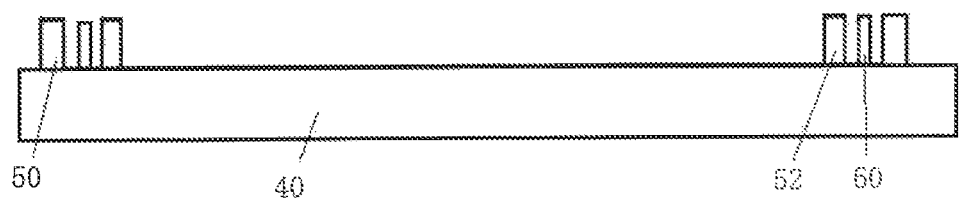
FIG. 4 is a schematic structural view showing an encapsulation cover after step S3 in a package method of the display device illustrated in FIG. 2.
Figure 5:
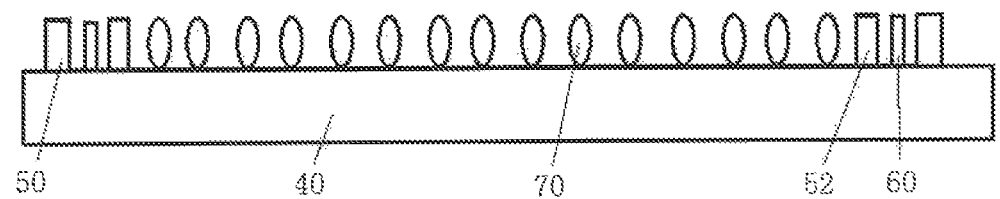
FIG. 5 is a schematic structural view showing an encapsulation cover after step S4 in a package method of the display device illustrated in FIG. 2.

Further, one embodiment provides a package method of the display device according to the present invention described above, it includes the following steps:

Step S1, providing a display panel, the display panel may be a liquid crystal display panel or an organic light emitting diode (OLED) display panel, depends on the needs. If adopts an OLED display panel, please refer to FIG. 2. It includes a thin film transistor (TFT) array substrate 10, on which an OLED device functional layer 20 is disposed, and the OLED device functional layer 20 is provided with a water blocking layer 30;

Step S2, providing an encapsulation cover 40, applying an outer border sealant 50 to an outer periphery of an encapsulation area of the encapsulation cover 40, and then applying an inner border sealant 52 to an inner side of the outer border sealant 50 spaced from the outer border sealant 50. The completed structure is shown in FIG. 3;

Step S3, applying a circle of desiccant 60, preferably Getter glue to an area between the outer border sealant 50 and the inner border sealant 52. The desiccant 60 is provided spaced apart from the outer border sealant 50 and is also spaced apart from the inner border sealant 52. The specific distance between the three can be determined according to the needs, and there is no limit. The completed structure is shown in FIG. 4;

Step S4, applying a filler (Fill glue) 70 to an area of the inner side of the inner border sealant 52. The completed structure is shown in FIG. 5; and Step S5, vacuum bonding the display panel with the encapsulation cover 40 and curing the outer border sealant 50, the desiccant 60, the inner border sealant 52, and the filler 70 by ultraviolet radiation or heating, thereby an encapsulation of the display panel according to the invention is completed. The completed structure is shown in FIG. 1.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A display device, comprising:
   a display panel, wherein the display panel comprises a substrate, an organic light-emitting diode device layer disposed on the substrate, and a water blocking layer encapsulating the organic light-emitting diode device layer; and
   an encapsulation cover disposed on the display panel;
   wherein an outer border sealant, a desiccant, and an inner border sealant are provided between an encapsulation area of the encapsulation cover and the substrate;
   wherein the inner border sealant is provided on an inner side of the outer border sealant and is spaced apart from the outer border sealant, and the desiccant is provided between the outer border sealant and the inner border sealant;
   wherein a height of the desiccant is equal to a height of the outer border sealant, a height of the inner border sealant, and a distance between the encapsulation cover and the substrate; and
   wherein an inner side of the inner border sealant is provided with a filler spaced apart from the inner border sealant, and the filler encapsulates the water blocking layer.

2. The display device according to claim 1, wherein the desiccant comprises getter.

3. The display device according to claim 1, wherein the outer border sealant is disposed spaced apart from the desiccant.

4. The display device according to claim 1, wherein the desiccant is disposed spaced apart from the inner border sealant.

5. The display device according to claim 1, wherein the display panel is an organic light-emitting diode display panel, and the substrate is a thin film transistor array substrate.

6. An encapsulation method for packaging the display device according to claim 1, comprising the steps of:
   Step S1, providing a display panel;
   Step S2, providing an encapsulation cover, applying an outer border sealant to an outer periphery of an encapsulation area of the encapsulation cover, and then applying an inner border sealant to an inner side of the outer border sealant spaced from the outer border sealant;
   Step S3, applying a getter to an area between the outer border sealant and the inner border sealant;
   Step S4, applying a filler to an area of the inner side of the inner border sealant; and
   Step S5, vacuum bonding the display panel with the encapsulation cover and curing the outer border sealant, the getter, the inner border sealant, and the filler, thereby an encapsulation of the display panel is completed.

7. The encapsulation method according to claim 6, wherein the outer border sealant, the getter, the inner border sealant, and the filler are cured by ultraviolet radiation or heating.

* * * * *